(12) United States Patent
Bingham

(10) Patent No.: US 7,541,868 B2
(45) Date of Patent: Jun. 2, 2009

(54) DELAY MODULATOR PRE-DISTORTION CIRCUIT FOR AN AMPLIFIER

(75) Inventor: Jim A. Bingham, Westerville, OH (US)

(73) Assignee: Andrew, LLC, Hickory, NC (US)

( * ) Notice: Subject to any disclaimer, the term of this patent is extended or adjusted under 35 U.S.C. 154(b) by 43 days.

(21) Appl. No.: 11/756,296

(22) Filed: May 31, 2007

(65) Prior Publication Data

US 2008/0297245 A1 Dec. 4, 2008

(51) Int. Cl.
*H03F 1/26* (2006.01)
(52) U.S. Cl. .................................. 330/149; 330/151
(58) Field of Classification Search ................ 330/149, 330/151; 375/297; 455/114.3
See application file for complete search history.

(56) References Cited

U.S. PATENT DOCUMENTS

| | | | |
|---|---|---|---|
| 4,194,154 A | 3/1980 | Kahn | |
| 5,444,418 A | 8/1995 | Mitzlaff | |
| 5,880,633 A | 3/1999 | Leizerovich et al. | |
| 5,886,575 A | 3/1999 | Long | |
| 6,097,252 A | 8/2000 | Sigmon et al. | |
| 6,172,560 B1 * | 1/2001 | Yamashita et al. | 330/52 |
| 6,262,629 B1 | 7/2001 | Stengel et al. | |
| 6,469,581 B1 | 10/2002 | Kobayashi | |
| 6,472,934 B1 | 10/2002 | Pehlke | |
| 6,710,652 B2 * | 3/2004 | Miyaji et al. | 330/151 |
| 6,744,317 B2 * | 6/2004 | Kim et al. | 330/151 |
| 6,864,742 B2 | 3/2005 | Kobayashi | |
| 6,947,711 B1 | 9/2005 | Leyonhjelm | |
| 7,042,283 B2 | 5/2006 | Suzuki et al. | |
| 2004/0135630 A1 | 7/2004 | Hellberg | |
| 2004/0174212 A1 | 9/2004 | Kim et al. | |
| 2004/0263246 A1 | 12/2004 | Robinson et al. | |
| 2005/0195919 A1 | 9/2005 | Cova | |
| 2005/0258898 A1 | 11/2005 | Hongo | |
| 2006/0097783 A1 | 5/2006 | Okubo et al. | |
| 2006/0109053 A1 | 5/2006 | Kim et al. | |
| 2006/0145757 A1 | 7/2006 | Kim et al. | |
| 2006/0152279 A1 | 7/2006 | Kijima | |

FOREIGN PATENT DOCUMENTS

EP 1068666 B1 5/2003

OTHER PUBLICATIONS

Kelly Mekechuk, et al.; Test Instruments Coupled with EDA software maximize Doherty Amplifier Linearity and Efficiency; article; Sep. 27, 2004; 2; EETIMES.
Yu Zhao, et al.; Doherty Amplifier with DSP Control to Improve Performance in CDMA Operation; article; 2003EEE; La Jolla, CA, USA.

* cited by examiner

*Primary Examiner*—Henry K Choe
(74) *Attorney, Agent, or Firm*—Wood, Herron & Evans, LLP

(57) ABSTRACT

A circuit for pre-distorting a signal input to an amplifier includes a signal divider operable for dividing an input signal into signal portions that travel in a primary path and a secondary path. A delay element in each of the primary and secondary paths introduces a group delay to the signal portions in the respective paths. A signal combiner is operable for combining the signals in the respective paths into a combined output signal. A variable gain circuit is arranged in each of the primary and secondary paths. The variable gain circuit is operable to vary the level of the input signal in each path and thereby modulate the overall phase delay of the combined output signal.

36 Claims, 4 Drawing Sheets

DELAY MODULATOR PRE-DISTORTION CIRCUIT FOR AN AMPLIFIER

FIELD OF THE INVENTION

The present invention relates to power amplifiers, and, specifically to a pre-distortion circuit that addresses distortion characteristics in power amplifiers, such as Doherty amplifiers and other efficiency-enhanced amplifiers.

BACKGROUND OF THE INVENTION

Radio frequency (RF) communication systems and applications, such as wireless voice and data applications, require power amplifiers that are both efficient and linear. However, both characteristics often work against each other, such that highly linear power amplifiers are often very inefficient, whereas more efficient amplifier designs sacrifice linearity. Conventional power amplifiers generally operate at maximum efficiency at or near saturation, which affects their linearity.

Therefore, in order to accommodate RF communication signals, that have varying amplitudes, the power amplifiers within a wireless communications system are often operated in different modes, depending upon the amplitude of the input signal that is to be amplified. For example, power amplifiers might normally operate below peak efficiency for a substantial portion of their time. To address such amplification needs, Doherty amplifiers, and other amplifiers that have enhanced efficiency, such as Enhanced Class AB (ECAB) amplifiers, are utilized. For example, U.S. Pat. Nos. 6,922,102 and 7,064,606 illustrate amplifiers, which provide a desirable balance of efficiency and linearity.

However, such ECAB/Doherty amplifiers also have distortion characteristics that illustrate a phase variation, based on frequency. These distortion characteristics might be considered a spinning of the AM/PM characteristic, where the AM/PM characteristic rotates counter-clockwise with frequency. For example, the AM/PM curves for an amplifier might be reviewed using a network analyzer, which is swept over power within the desired frequency range. In reviewing the AM/PM curves over several frequencies, the inventors determined that the delay of the amplifier reduces as input power increases. This kind of distortion is most difficult to correct over wide bandwidths, as it generates an effect that is often assumed to be a memory effect. Therefore, while ECAB/Doherty amplifiers provide a desirable tradeoff between efficiency and linearity, they also exhibit distortion characteristics that are undesirable.

DETAILED DESCRIPTION OF THE EMBODIMENTS OF THE INVENTION

The present invention addresses the shortcomings in the prior art by providing pre-distortion of a signal to be amplified by an RF power amplifier. The pre-distortion circuit utilizes modulation of delays within multiple paths of a signal in order to thereby modulate the overall group delay of a combined output signal that is to be amplified. An input signal is divided into signal portions in multiple paths, with delay elements in the various respective paths. Utilizing variable gain circuits in each path, the level of the input signal portion in each path is varied, thus modulating the overall group delay of an output signal from the combined signal portions from each path. The pre-distortion circuit is useful for efficient linear amplifiers, such as Doherty amplifiers and Enhanced Class AB amplifiers, as well as other amplifiers that exhibit the phase distortion noted above.

Figure 1:
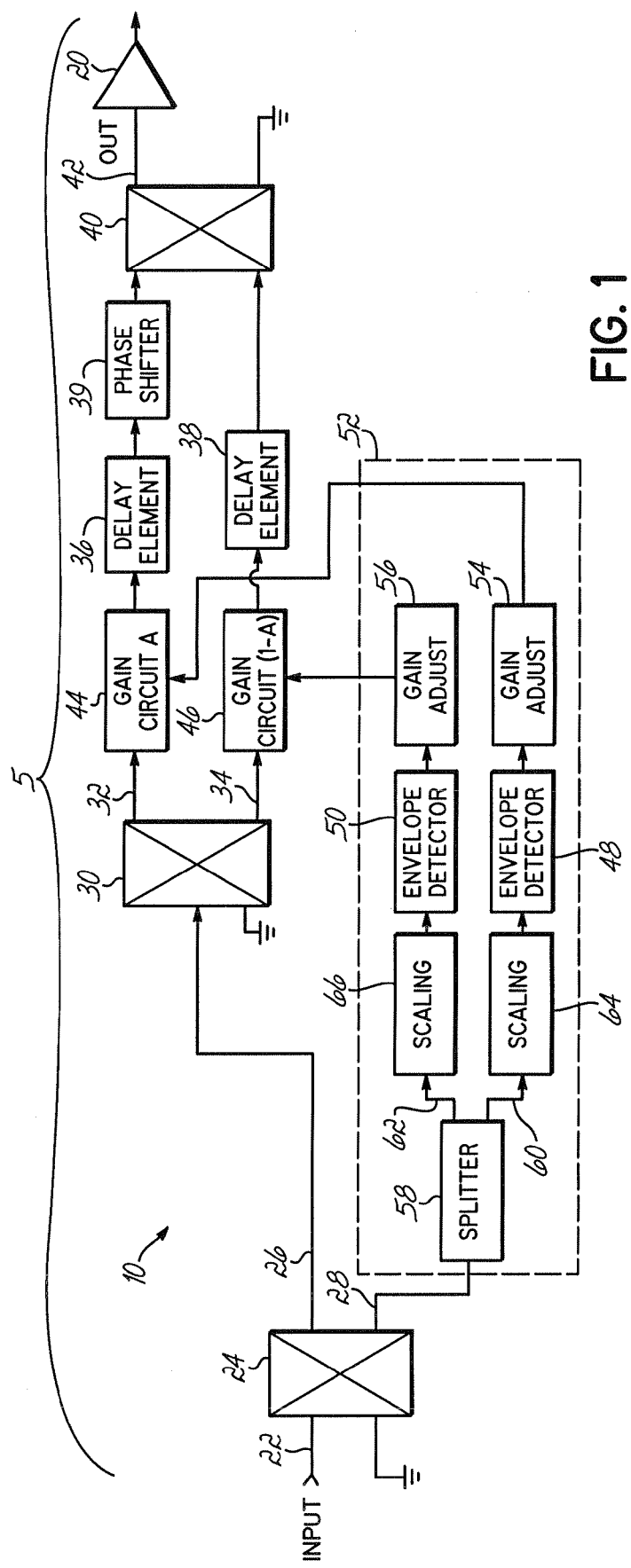
FIG. 1 is a schematic diagram of one embodiment of an amplifier system with a pre-distortion circuit that provides delay modulation in accordance with aspects of the invention.

FIG. 1 illustrates one embodiment of an amplifier system 5 that has a pre-distortion circuit 10, in accordance with aspects of the present invention utilized in combination with an RF power amplifier 20. As noted, the RF power amplifier might be a Doherty amplifier or an Enhanced Class AB amplifier, or other suitable RF amplifier that may have single or multiple amplification stages. Thus, element 20 is merely illustrative of an amplifier element without being limiting.

Pre-distortion circuit 10 operates upon an input signal 22 that is to be amplified by amplifier 20. The circuit 10 utilizes a signal divider 24 or other signal-splitting device for dividing the input signal 22 between a processing path 26 and a sampling path 28. In one embodiment of the invention, the signal divider 24 might be a 90° hybrid coupler, as illustrated in FIG. 1, wherein the input signal 22 is divided into output signals 26 and 28. The signal on the processing path 26 is directed to another signal divider or splitter 30, which divides a portion of the input signal 22 that is on path 26 into input signal portions that travel in a primary path 32 and a secondary path 34 in circuit 10. Signal paths 32 and 34 are considered to include signal splitter 30 and signal combiner 40. Again, a suitable signal divider 30 might be a 90° hybrid coupler.

A signal delay element, such as delay elements 36 and 38, are incorporated into the respective signal paths 32 and 34. The delay elements introduce a group delay to the signal portion in each respective path in accordance with one aspect of the invention. The delayed signal portions in the paths 32 and 34 are then combined in a signal combiner 40, as illustrated in FIG. 1. Signal combiner 40, which also may be a 90° hybrid coupler, combines the input signal portions of the primary 32 and secondary paths 34 into the combined output signal 42 that is input to amplifier 20. In accordance with aspects of the invention, the output signal 42 is thereby pre-distorted in order to address distortion characteristics introduced by the RF power amplifier 20 when signal 42 is amplified. As noted above, the power amplifier, or power amplification circuit 20 might be any suitable amplifier design that may benefit from the invention. Furthermore, while circuit 10 and power amplifier 20 of system 5 are indicated as individual elements, all such circuits may be combined into one overall amplifier circuit within a single housing, wherein circuit 10 is implemented to pre-distort an input signal to the amplifier 20.

In accordance with one aspect of the invention, in each of the primary path 32 and secondary path 34, a variable gain circuit 44, 46 is utilized and is operable to vary the level of the input signal in each path and to vary the level of the delayed signal portion that is directed to the signal combiner 40. Each of the signals in the primary and secondary paths is delayed by the respective delay element 36 and 38. Those delayed signals are then combined by the signal combiner 40 to an output 42. By varying the portion of a particular delayed signal from each path that contributes to the combined output signal 42, the overall phase delay of the combined output signal 42 may be varied or modulated, thus providing pre-distortion in the form of a delay modulation that affects the delay of the output signal 42. Suitable delay elements, for example, might be in the form of lengths of coaxial cable, such as TEM mode delay lines that are generally dispersion-free. The ideal performance of the pre-distortion circuit 10 might then be modeled in simplified form as:

$$V_o = \frac{A \cdot e^{-j\beta d_1} + (1-A) \cdot e^{-j\beta d_2}}{2} V_i$$

This assumes ideal hybrid couplers and delay elements expressed in distances $d_1$ and $d_2$ and a gain of A for the variable gain circuit 44 in the primary path and a gain of (1−A) for the variable gain circuit 46 in the secondary path. Thus, the present invention produces a linear variation and delay in the combined output signal 42 that varies with the gains A and (1−A) in the respective paths. The delay change will be $$\frac{\beta d_2}{\omega}$$

delay (secondary) minus $$\frac{\beta d_1}{\omega}$$

delay (primary), as the gain A goes from 0 to 1. The gain flatness will suffer when A does not equal 0 or 1, and the gain flatness is determined by the bandwidth and difference in the two delays. Generally, the gain flatness will be worst at A=0.5.

The variable gain circuits 44 and 46 might be implemented in various different ways, such as by utilizing variable gain amplifiers, multiplier chips, or variable attenuators, for example. In one embodiment of the invention, high speed attenuators are utilized, and are controlled by a measurement of the input signal to circuit 10, as provided by respective envelope detectors 48, 50, as discussed below. Utilizing a variable attenuator, the voltage attenuation of the signals in paths 32 and 34 may be considered a multiplier function. That is, the maximum gain of A=1 would correspond to the lowest attenuation for circuit 44. Similarly, the lowest gain of A=0 would be considered a perfect attenuation. In accordance with one aspect of the invention, the variable gain circuits are generally inversely related, such that circuit 44 has a gain of A, and circuit 46 has a gain of (1−A), as A is varied between 0 and 1 (0<A≦1). At the designed center frequency where the insertion phase of both paths 32 and 34 are identical, the output voltage is provided by equation 1 above. By varying the group delay provided by each delay element 36 and 38, where the $d_1$ provided by delay element 36 is not equal to $d_2$ and with the center band phase delay being identical, circuit 10 provides a delay modulator that modulates the delay of the output signal 42. The addition of the pre-distortion from circuit 10 with amplifier 20 results in significantly reduced AM/PM distortion.

Turning again to FIG. 1, the delay elements 36 and 38 in the primary and secondary paths have different values, and thereby introduce different group delays. In one embodiment, the delay element in the primary path introduces a group delay in the signal portion of the primary path that is greater than the group delay introduced by the delay element 38 in the secondary path.

To implement the present invention, the variable gain circuits are each coupled to a control sub-circuit 52 that includes one or more analog gain adjustment circuits 54, 56. The gain adjustment circuits 54, 56 provide gain variation for each of the respective variable gain circuits 44, 46 according to the invention. Each of the gain adjustment circuits 54, 56 is coupled to a respective envelope detector 48, 50, which controls their operation. Specifically, the control sub-circuit 52 utilizes the signal from sample path 28, and further splits that signal, utilizing a signal splitter 58, into individual control paths 60, 62. A portion of the input signal 22 in path 28 is thus provided to the envelope detectors 48, 50, which determine the level of the input signal. The detailed level of the input signal is used to operate the gain adjustment circuits that vary the gains of each of the variable gain circuits 44, 46.

In accordance with one aspect of the invention, at lower signal levels, it is desirable to have a shorter effective delay from circuit 10. In one embodiment of the invention, delay element 38 in the secondary path provides or introduces a group delay that is less than the group delay introduced by the delay element 36 in the primary path 32 (or element 36 introduces a greater delay than element 38). Therefore, for lower input signal levels, as determined by the envelope detectors 48, 50, the variable gain circuits are operated so that A is at or close to 0. The gain of variable gain circuit 44 is 0 (maximum attenuation) and the gain of variable gain circuit 46 is at or close to 1 (minimum attenuation). Therefore, the output signal 42 is primarily influenced by the lower delay in the secondary path 34 from element 38. Alternatively, at higher signal levels, it is desirable to have a longer effective delay. Therefore, the variable gain circuits are operated so that A moves closer to 1, such that circuit 44 provides maximum gain (minimum attenuation), while circuit 46 moves to minimum gain of (A−1) or 0 (maximum attenuation). In that way, the output signal would be more influenced by the greater delay in the primary path 32. In that way, based on control of the variable gain circuits, delay modulation is provided to input signal 22.

In the embodiment of the invention illustrated in FIG. 1, one or more of the paths 60, 62 may include a scaling circuit that is operable for scaling a portion of the input signal to thereby vary the gain of the variable gain circuit through the analog gain adjustment circuits. That is, the respective scaling circuits 64, 66 scale a portion of the input signal prior to the envelope detectors 48, 50 for effecting the operation of the gain adjustment circuits 54, 56. The scaling circuits 64 and 66 have two primary purposes: to adjust for small errors in components and to set the range of input signal that the delay modulator effects. In that way, circuit 10 may be tuned to address imperfections in various of the components of the circuit, such as signal dividers 24 and 30, as well as the attenuation that may be provided by a variable gain circuit, as well as differences in the desired delays provided by delay elements 36, 38. Adjusting of scaling and gain adjust circuits can be varied to adjust for optimum delay distribution to compensate for the delay characteristics of the amplifier 20.

In the control sub-circuit 52, the path 60 corresponds to the primary path and variable gain circuit 44, while path 62 corresponds to the secondary path and variable gain circuit 46. The scaling circuits may be configured to address component imperfections and provide a more practical implementation of the delay modulator circuit of the invention. Specifically, scaling circuit 66 might provide scaling of the variable gain circuit 46 in the secondary path, according to equation 2 below:

$$G_p = A$$

$$G_s = 1 - \alpha G_p$$

$$A \equiv 0 \rightarrow 1$$

That is, the scaling circuit controls α. This allows a fine-tuning of the secondary gain from circuit 46 to achieve an ideal gain of A and (1−A) for the respective variable gain circuits.

Furthermore, the control sub-circuit 52 might further be configured to provide a linear offset to a portion of the input signal in path 62 for varying the gain of a variable gain circuit 46. For example, due to component imperfections, the gain of variable gain circuit 46 might not closely approximate the desired (1−A) parameter. That is, in equation (1−A), the circuit may not exactly provide an ideal "1" such that the range of the gain in circuit 46 may not fluctuate between the desired "0" and "1". Accordingly, control sub-circuit 52 might be configured to operate and provide a linear offset, according to Equation 3 below:

$$G_p = A$$

$$G_s = \beta - G_p$$

$$A \equiv 0 \rightarrow 1$$

This offset might be implemented, for example, in the gain adjust circuit 56 which provides a fixed gain with an offset. By providing an adjustment of β, the secondary $G_s$ may be made fine-tuned to be closer to "1" and "0" in the implementation of the (1−A) gain.

Scaling circuit 64 might be configured for adjusting the variable gain circuit 44 in the primary path 32, similar to the way in which scaling circuit 66 adjusts the secondary path gain. To that end, scaling circuit 64 might be configured to provide a scalability of primary $G_p$, as shown below:

$$G_p = \gamma A$$

$$G_s = 1 - A$$

$$A \equiv 0 \rightarrow 1$$

Thereby, scaling circuit 64 may be configured to address γ and vary the primary path gain. If the scaling circuit provides lots of gain, the envelope detector will produce a large signal that will have to be reduced by the gain adjust circuit to meet some fixed requirements of the gain circuits. This will cause the invention to affect the AM/PM over a greater range of "Normalized Amplitude". Generally, envelope detectors have a threshold below which they do not produce an output. A lower gain in the scaling circuit may be offset by increased gain in the respective gain adjust circuit to produce the effect of effecting the AM/PM over a smaller range of "Normalized Amplitude". One additional use of the offset/scaling features, other than correcting for imperfections as noted, is to intentionally create a tilt in the AM/AM characteristics.

Figure 2:
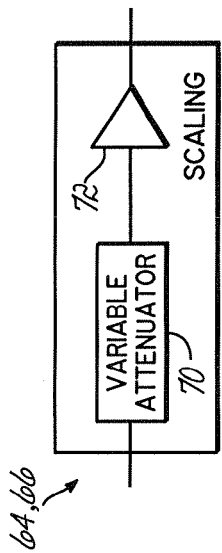
FIG. 2 is a schematic diagram of a scaling circuit that might be utilized in the circuit of FIG. 1.

The scaling circuits 64, 66 might be implemented as shown in FIG. 2 utilizing a variable attenuation 70 and an amplifier 72 to provide the desired scaling for the signals prior to envelope detectors 48, 50. Further tuning of the circuit 10 might also be implemented by the use of an optional phase shifter 39, such as in primary path 32. This phase shifter is adjusted to make the insertion phase of signal paths 32 and 34 equal at the desired band, effectively providing a fine adjustment to control the center frequency. The phase shifter could be inserted in the secondary path 34 as an alternative. The present invention thus provides a desired delay modulation, thus a phase modulation reflective of the level of the input signal, and provides a pre-distortion to a signal input to an RF power amplifier 20, to address the distortion in AM/PM provided by the amplifier.

Figure 3A:
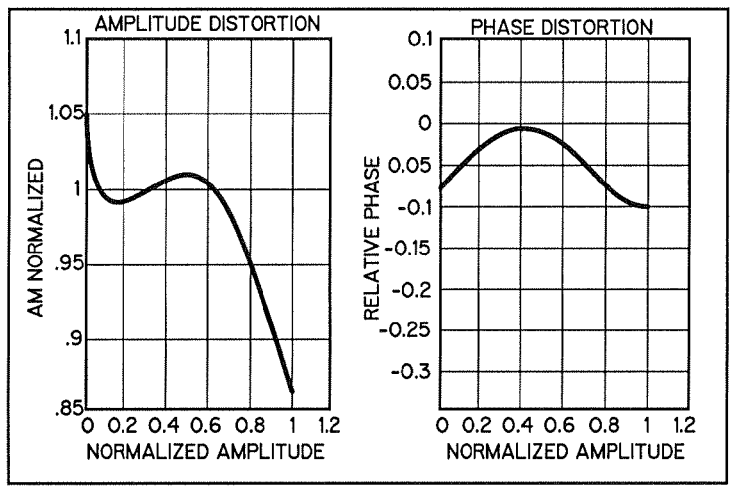
FIGS. 3A-3C graphically illustrate measured distortion characteristics for a communication system utilizing an RF power amplifier of Doherty or ECAB topology across a lower frequency, mid-frequency, and upper-frequency.
Figure 3B:
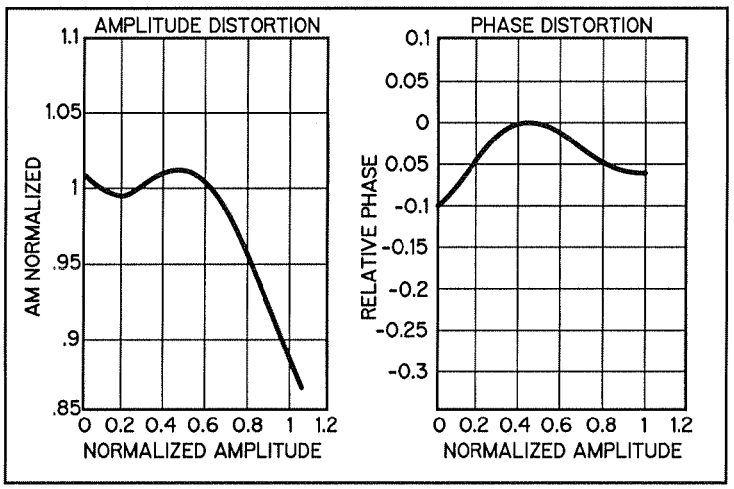
Figure 3C:
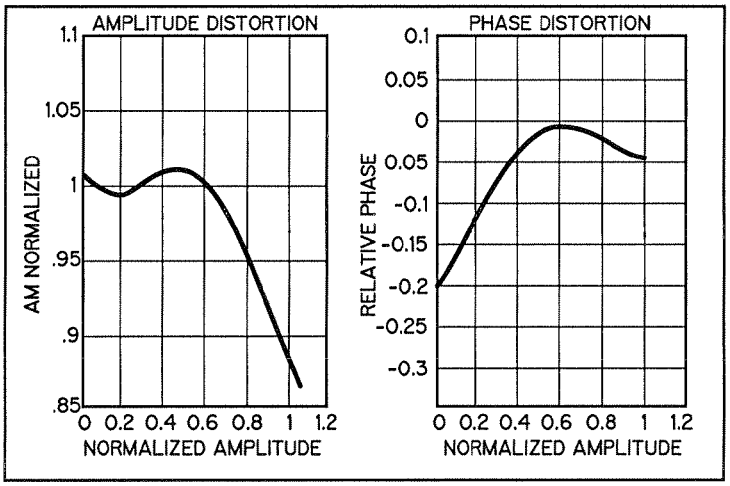

FIGS. 3A-3C graphically show the possible distortion characteristics of an RF power amplifier 20 or amplification system chain in a lower band (869 MHz), a center band (881 MHz), and an upper band (894 MHz). In the embodiment of the invention was tested to provide desirable high-speed delay modulator. Digital multipliers, such as ADL5391 multipliers from Analog Devices, Inc., were used for the variable gain circuits 44, 46. The delay elements 36, 38 were implemented with coax line. The control circuit 52 utilizes envelope detectors and the analog gain adjust circuits 54, 56 were implemented utilizing a THS3202 current feedback operational amplifier from Texas Instruments and two THS4405 fully differential amplifiers available from Texas Instruments in a conventional fashion as would be understood by a person of ordinary skill in the art.

As illustrated in FIGS. 3A-3C, illustrated circuit 10 was driven a approximately −6.3 dBm power. The test signal that was used included eight GSM carriers spaced 400 kHz apart. The center band frequency noted was the center of the eight GSM carriers.

In each of the FIGS. 3A, 3B, and 3C, the left side provides the AM/AM characteristic, while the right side provides the AM/PM characteristic. This is similar to the FIGS. 4A-4C and 5A-5C as well. Referring to FIGS. 3A-3C, it may be seen that the AM/PM characteristic shows a general downward slope in the lower band and center band, and an upper slope in the upper band. The pre-distortion circuit of the present invention in the form of the delay modulator addresses such characteristic of the amplifier chain 20.

Figure 4A:
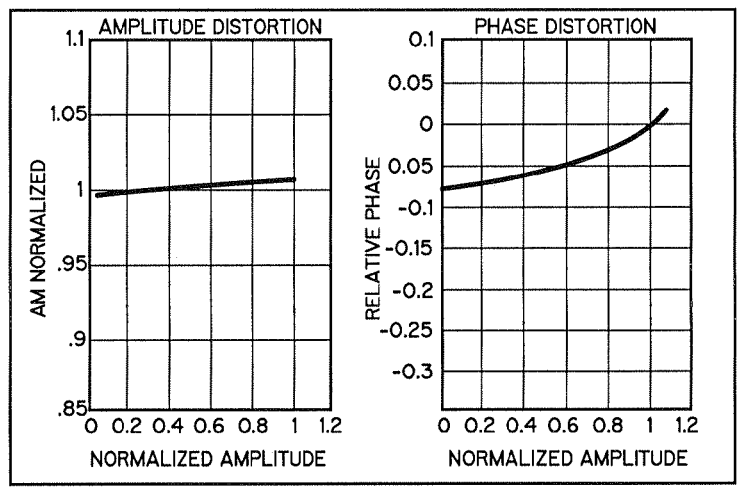
FIGS. 4A-4C graphically illustrate measured distortion characteristics for one embodiment of a pre-distortion circuit, in accordance with aspects of the invention.
Figure 4B:
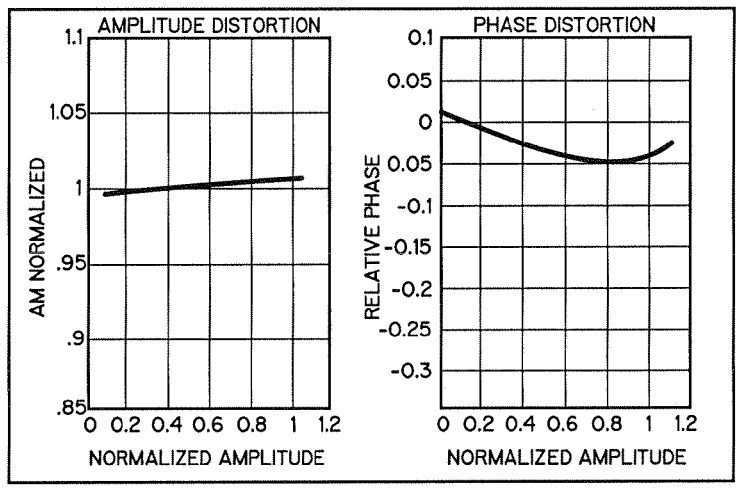
Figure 4C:
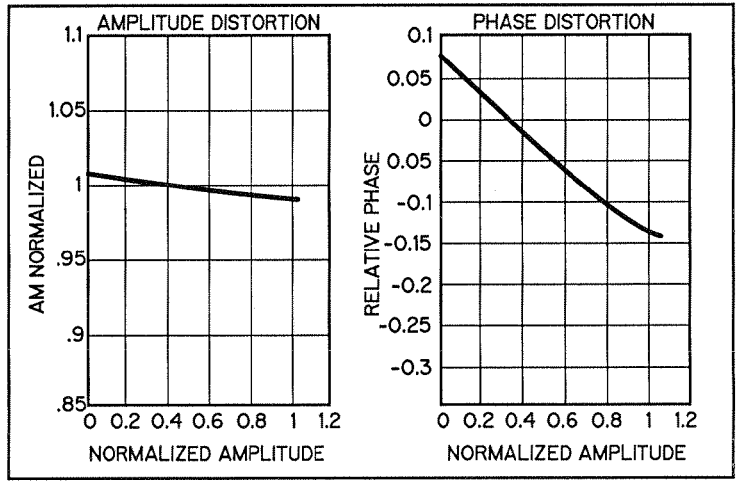
Figure 5A:
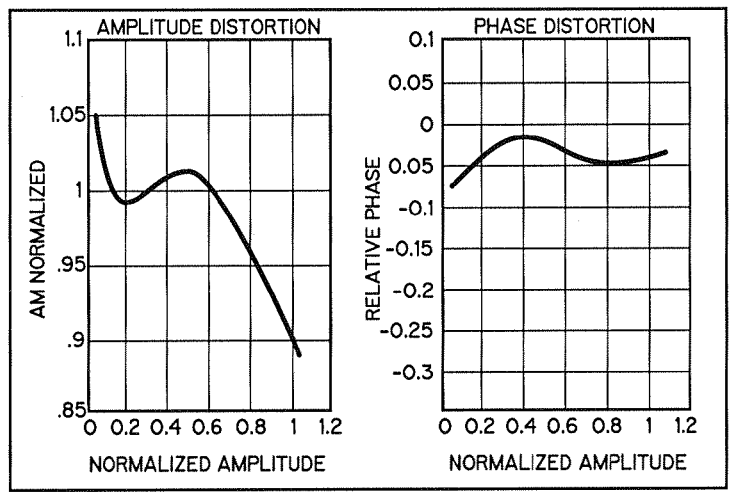
FIGS. 5A-5C graphically illustrate measured distortion characteristics for a communication system utilizing a pre-distortion circuit, in accordance with the invention.
Figure 5B:
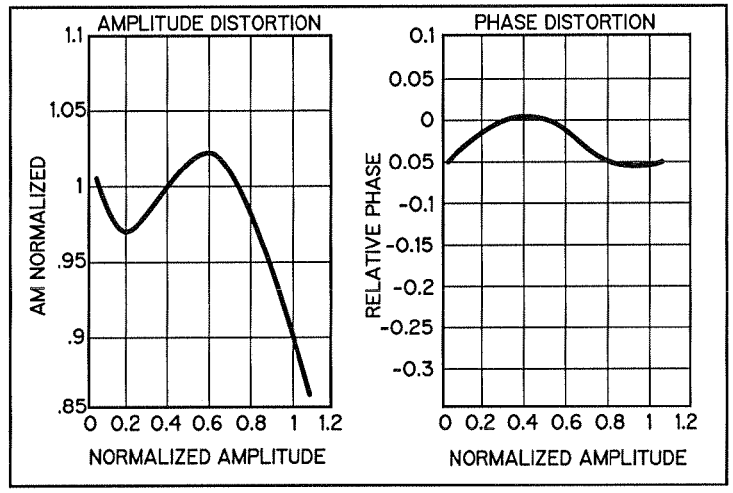
Figure 5C:
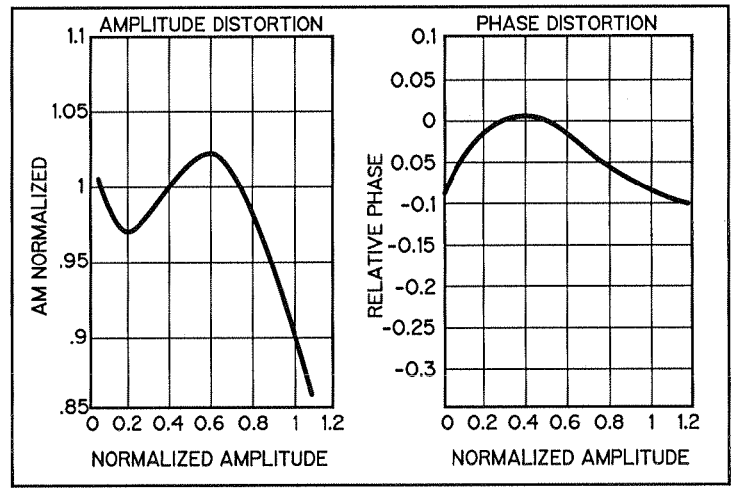

FIGS. 4A-4C illustrate the AM/PM characteristics of the pre-distortion circuit 10 and show that the slopes of the AM/PM characteristics provided by the pre-distortion circuit 10 provide a generally upward slope from the lower band, and a downward slope in the upper band, with a generally flat response at the center band. In accordance with one aspect of the invention, this has the desired effect on the output of amplifier chain 20, as shown in FIGS. 5A-5C, wherein, at all three frequencies, the AM/PM general slope is slightly downward, that is, the slopes are made similar. The character of the AM/PM still varies over frequency, which is consistent with the original amplifier chain characteristics, as illustrated in FIGS. 3A-3C.

Other observations might also be determined from FIGS. 3A-3C, 4A-4C, and 5A-5C. One observation is that the delay modulator pre-distortion circuit 10, as shown in FIGS. 4A and 4C and the amplifier chain illustrated in FIGS. 3A-3C, are not centered in frequency. This is ascertained by observing the position of the AM/PM characteristics at the center band. The general trend for the amplifier chain and pre-distortion circuit is a negative AM/PM slope at center frequency. Since these are in the same direction, it is anticipated that this will cause additional AM/PM slope at the center band. It may also be noted that the phase spin over frequency of the delay modulator pre-distortion circuit, as illustrated in FIGS. 4A-4C, is opposite that of the amplifier chain, as is desired. Additionally, it might be observed that the AM/AM of the delay modulator pre-distortion circuit shows some gain expansion. Some level of misalignment in the delay modulator likely causes this gain characteristic.

Thus, while the present invention has been illustrated by a description of various embodiments, and, while these embodiments have been described in considerable detail, it is not the intention of the applicant to restrict or in any way limit the scope of the appended claims to such detail. Additional advantages and modifications will readily appear to those skilled in the art. Thus, the invention in its broader aspects is not limited to the specific details, representative apparatus and method, and illustrative example shown and described. Accordingly, departures may be made from such details without departing from the spirit or scope of applicant's general inventive concept.

What is claimed is:

1. A circuit for pre-distorting a signal input to an amplifier comprising:
    a signal divider operable for dividing an input signal into signal portions that travel in a primary path and a secondary path;
    a delay element in each of the primary and secondary paths for introducing a group delay to the signal portions in the respective paths, the delay elements having different values between the paths to introduce different delays to the signal portions in each of the respective paths;
    a signal combiner operable for combining the signal portions in the respective paths into a combined output signal having an effective delay that is influenced by a combination of the delays of the signal portions in the primary and secondary paths;
    a variable gain circuit arranged in each of the primary and secondary paths, the variable gain circuits operable, based on the level of the input signal, to vary the level of the input signal portion that each path contributes to the combined output signal and thereby vary the effect of each signal portion delay on the effective delay of the combined output signal for modulating the effective delay of the combined output signal.

2. The circuit of claim 1 wherein variable gain circuits in the primary and secondary paths inversely vary the level of the input signal portion in each path.

3. The circuit of claim 1 wherein the delay element in the primary path introduces a group delay in the signal portion of the primary path that is greater than the group delay introduced by the delay element in the secondary path.

4. The circuit of claim 1 further comprising a gain adjustment circuit coupled to at least one of the variable gain circuits and operable for adjusting the gain of the variable gain circuit based on the level of the input signal.

5. The circuit of claim 4 further comprising an envelope detector coupled to the gain adjustment circuit for detecting the level of the input signal.

6. The circuit of claim 4 further comprising a second signal divider for dividing the input signal between the gain adjustment circuit and the signal divider that forms the primary and secondary paths.

7. The circuit of claim 1 wherein the variable gain circuit in the primary path has a gain of (A) and the variable gain circuit in the secondary path has a gain of (1−A) based on the gain of the primary path variable gain circuit.

8. The circuit of claim 4 wherein the gain adjustment circuit is coupled to the variable gain circuit in the secondary path, the circuit further comprising a secondary scaling circuit operable for scaling a portion of the input signal to vary the gain of the variable gain circuit.

9. The circuit of claim 4 wherein the gain adjustment circuit is coupled to the variable gain circuit in the primary path, the circuit further comprising a primary scaling circuit operable for scaling a portion of the input signal to vary the gain of the variable gain circuit.

10. The circuit of claim 4 wherein the gain adjustment circuit provides a linear offset to the portion of the input signal for varying the gain of the variable gain circuit.

11. The circuit of claim 1 further comprising a phase shifter in at least one of the primary path or secondary path following the respective delay element.

12. A circuit for pre-distorting a signal input to an amplifier comprising:
    a circuit operable for dividing an input signal into signal portions in a primary path and a secondary path, the paths each including delay elements having different values from each other to introduce different group delays to the signal portions in each respective path, the circuit further operable for combining the signal portions on the primary and secondary paths to form a combined output signal;
    the combined output signal having an effective delay that is influenced by a combination of the delays of the signal portions in the primary and secondary paths;
    a variable gain circuit arranged in each of the primary and secondary paths, the variable gain circuits operable, based on the level of the input signal, to vary the level of the input signal portion that each path contributes to the combined output signal and thereby vary the effect of each signal portion delay on the effective delay of the combined output signal for modulating the effective delay of the combined output signal.

13. The circuit of claim 12 wherein the delay element in the primary path introduces a group delay in the signal portion of the primary path that is greater than the group delay introduced by the delay element in the secondary path.

14. The circuit of claim 12 further comprising a gain adjustment circuit coupled to at least one of the variable gain circuits and operable for adjusting the gain of the variable gain circuit based on the level of the input signal.

15. The circuit of claim 12 further comprising a gain adjustment circuit coupled to each of the variable gain circuits and operable for adjusting the gain of the respective variable gain circuit based on the level of the input signal.

16. The circuit of claim 12 wherein the variable gain circuits inversely vary the level of the input signal portion in each path.

17. The circuit of claim 16 wherein the variable gain circuit in the primary path has a gain of (A) and the variable gain circuit in the secondary path has a gain of (1−A) based on the gain of the primary path variable gain circuit.

18. The circuit of claim 14 wherein the gain adjustment circuit is coupled to the variable gain circuit in the secondary path, the circuit further comprising a secondary scaling circuit operable for scaling a portion of the input signal to vary the gain of the variable gain circuit.

19. The circuit of claim 14 wherein the gain adjustment circuit is coupled to the variable gain circuit in the primary path, the circuit further comprising a primary scaling circuit operable for scaling a portion of the input signal to vary the gain of the variable gain circuit.

20. The circuit of claim 14 wherein the gain adjustment circuit provides a linear offset to the portion of the input signal for varying the gain of the variable gain circuit.

21. An amplifier comprising:
a circuit operable for dividing an input signal into a primary path and a secondary path, the paths each including delay elements having different values from each other to introduce different group delays to the signal portions in each respective path, the circuit further operable for combining the signal portions of the primary and secondary paths to form a combined output signal;
the combined output signal having an effective delay that is influenced by a combination of the delays of the signal portions in the primary and secondary paths;
a variable gain circuit arranged in each of the primary and secondary paths, the variable gain circuits operable, based on the level of the input signal, to vary the level of the input signal portion that each path contributes to the combined output signal and thereby vary the effect of each signal portion delay on the effective delay of the combined output signal for modulating the effective delay of the combined output signal;
a power amplification circuit operable for amplifying the combined output signal to form an amplified signal.

22. The amplifier of claim 21 wherein the delay element in the primary path introduces a group delay in the signal portion of the primary path that is greater than the phase delay introduced by the delay element in the secondary path.

23. The amplifier of claim 21 further comprising a gain adjustment circuit coupled to at least one of the variable gain circuits and operable for adjusting the gain of the variable gain circuit based on the level of the input signal.

24. The amplifier of claim 21 further comprising a gain adjustment circuit coupled to each of the variable gain circuits and operable for adjusting the gain of the respective variable gain circuit based on the level of the input signal.

25. The amplifier of claim 21 wherein the variable gain circuits inversely vary the level of the input signal portion in each path.

26. The amplifier of claim 25 wherein the variable gain circuit in the primary path has a gain of (A) and the variable gain circuit in the secondary path has a gain of (1−A) based on the gain of the primary path variable gain circuit.

27. The amplifier of claim 21 wherein the power amplification circuit includes at least one of a Doherty amplifier or an enhanced class AB amplifier.

28. A method for pre-distorting a signal to be amplified comprising:
dividing an input signal into signal portions that travel in a primary path and a secondary path;
introducing a different group delays to the signal portions in each of the respective paths;
combining the signal portions in the respective paths into a combined output signal having an effective delay that is influenced by a combination of the delays of the signal portions in the primary and secondary paths;
varying, with a variable gain circuit in each path, the level of the input signal portion that each path contributes to the combined output signal and thereby varying the effect of each signal portion delay on the effective delay of the combined output signal for modulating the effective delay of the combined output signal.

29. The method of claim 28 further comprising inversely varying the levels of the input signal portions in the primary and secondary paths.

30. The method of claim 29 further comprising introducing a group delay in the signal portion of the primary path that is greater than the group delay introduced in the secondary path.

31. The method of claim 28 further comprising adjusting the gain of the variable gain circuit in a path based on the level of the input signal.

32. The method of claim 28 wherein the variable gain circuit in the primary path has a gain of (A) and the variable gain circuit in the secondary path has a gain of (1−A) based on the gain of the primary path variable gain circuit.

33. The method of claim 31 further comprising scaling a portion of the input signal to vary the gain of the variable gain circuit of the secondary path.

34. The method of claim 31 further comprising scaling a portion of the input signal in to vary the gain of the variable gain circuit of the primary path.

35. The method of claim 33 further comprising providing a linear offset to a portion of the input signal for varying the gain of the variable gain circuit of the secondary path.

36. The method of claim 1 further comprising providing a phase shift in at least one of the primary path or the secondary path.

* * * * *